(12) United States Patent
Ito (10) Patent No.: US 7,049,185 B2
(45) Date of Patent: May 23, 2006

(54) SEMICONDUCTOR DEVICE HAVING DUMMY GATES AND ITS MANUFACTURING METHOD

(75) Inventor: Kazuyuki Ito, Tokyo (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 09/735,005

(22) Filed: Dec. 12, 2000

(65) Prior Publication Data

US 2001/0004122 A1    Jun. 21, 2001

(30) Foreign Application Priority Data

Dec. 13, 1999  (JP)  ................... 11-352847

(51) Int. Cl.
H01L 21/338 (2006.01)
H01L 21/337 (2006.01)
H01L 21/336 (2006.01)
H01L 21/04  (2006.01)

(52) U.S. Cl. ............... 438/183; 438/193; 438/259; 438/270; 438/510

(58) Field of Classification Search ........... 438/183, 438/510, 193, 259, 270

See application file for complete search history.

(56) References Cited

U.S. PATENT DOCUMENTS

| 4,866,494 | A | * | 9/1989 | Kurosawa | ............... 257/303 |
| 5,498,565 | A | * | 3/1996 | Gocho et al. | ............ 438/427 |
| 5,885,856 | A | * | 3/1999 | Gilbert et al. | ........... 438/129 |
| 5,923,969 | A | * | 7/1999 | Oyamatsu | ............... 438/183 |
| 6,010,939 | A | * | 1/2000 | Bothra | ............... 438/381 |
| 6,140,687 | A | * | 10/2000 | Shimomura et al. | ...... 257/401 |
| 6,153,476 | A | * | 11/2000 | Inaba et al. | ............ 438/275 |
| 6,225,230 | B1 | * | 5/2001 | Nitta et al. | ............... 716/2 |
| 6,232,161 | B1 | * | 5/2001 | Chen et al. | ............ 438/129 |
| 6,312,997 | B1 | * | 11/2001 | Tran | ............... 438/230 |
| 6,327,695 | B1 | * | 12/2001 | Bothra et al. | ........... 438/129 |
| 6,346,736 | B1 | * | 2/2002 | Ukeda et al. | ............ 257/509 |

FOREIGN PATENT DOCUMENTS

| JP | 9-115905 | 5/1997 |
| JP | 09-181159 | 11/1997 |
| JP | 10-200109 | 7/1998 |
| JP | 10-092921 | 10/1998 |
| JP | 11-87657 | 3/1999 |
| JP | 11-214634 | 8/1999 |

* cited by examiner

Primary Examiner—Eddie Lee
Assistant Examiner—Samuel Admassu Gebremariam
(74) Attorney, Agent, or Firm—Hayes Soloway P.C.

(57) ABSTRACT

In a semiconductor device including active areas where transistors are formed and a field area for isolating the active areas from each other, the field area has a plurality of dummy areas where dummy gates are formed.

3 Claims, 16 Drawing Sheets

FIRST EMBODIMENT

Fig. 11B

SECOND EMBODIMENT

SEMICONDUCTOR DEVICE HAVING DUMMY GATES AND ITS MANUFACTURING METHOD

BACKGROUND OF THE INVENTION

1. Field of the Invention

The present invention relates to a semiconductor device having a plurality of dummy gates and its manufacturing method.

2. Description of the Related Art

Generally, a semiconductor device such as a metal oxide semiconductor (MOS) device is constructed by a gate and source/drain regions manufactured in self-alignment with the gate.

In a first prior art method for manufacturing a semiconductor device, a gate conductive layer is deposited on a monocrystalline silicon substrate. Then, a photoresist layer is coated on the gate conductive layer. Then, the photoresist layer is exposed to ultraviolet light via a photomask. In this case, for example, the photomask has a tight pattern such as a comb-shaped gate pattern and a coarse pattern such as an isolated gate pattern. Then, the photoresist layer is developed, so that the photoresist layer is patterned.

Next, the gate conductive layer is patterned by an etching process using the photoresist layer as a mask, so that the gate conductive layer is patterned.

Finally, the photoresist layer is removed. Thus, the gate conductive layer has gate patterns corresponding to the gate patterns, respectively. This will be explained later in detail.

In the first prior art method, even when the photomask has the same gate length, the gate length of the comb-shaped gate pattern of the gate conductive layer is smaller than the gate length of the isolated gate pattern of the gate conductive layer. This is due to the proximity effect caused by light diffraction and the amount of the gate conductive layer redeposited on the sidewall thereof after the etching process of the gate conductive layer.

In a second prior art method for manufacturing a semiconductor device (see JP-A-10-200109), a dummy gate is interposed between the gates, so as to homogenize the proximity effect and the amount of the redeposited gate conductive layer. This also will be explained later in detail.

In the second prior art method, however, when designing a photomask for the dummy gate, additional design time for dummy patterns thereof is required. In particular, if a plurality of kinds of comb-shaped gate patterns are present, the additional design time is enormously large, which would increase the turnaround time, thus increasing the manufacturing cost.

SUMMARY OF THE INVENTION

It is an object of the present invention to provide a semiconductor device having dummy gates and its manufacturing method, capable of reducing the turnaround time.

Another object is to provide a photomask used in such a semiconductor device manufacturing method.

According to the present invention, in a semiconductor device including active areas where transistors are formed and a field area for isolating the active areas from each other, the field area has a plurality of dummy areas where dummy gates are formed.

Also, in a method for manufacturing a semiconductor device, a shallow trench isolation layer is formed in a semiconductor substrate, so that active areas and a field area including dummy areas for isolating the active areas are partitioned. Then, gates are formed on the active areas and dummy gates are formed on the dummy areas.

Further, a photomask is constructed by a gate pattern for forming gates of transistors on a semiconductor substrate, and dummy gate patterns surrounding the gate pattern, for forming dummy gates on the semiconductor substrate. The dummy gate patterns are constructed by a reduction of dummy area patterns for forming a shallow trench isolation layer in the semiconductor substrate.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, prior art semiconductor devices will be explained with reference to FIGS. 1A, 1B, 1C, 2, 3A, 3B, 3C and 4.

Figure 1A:
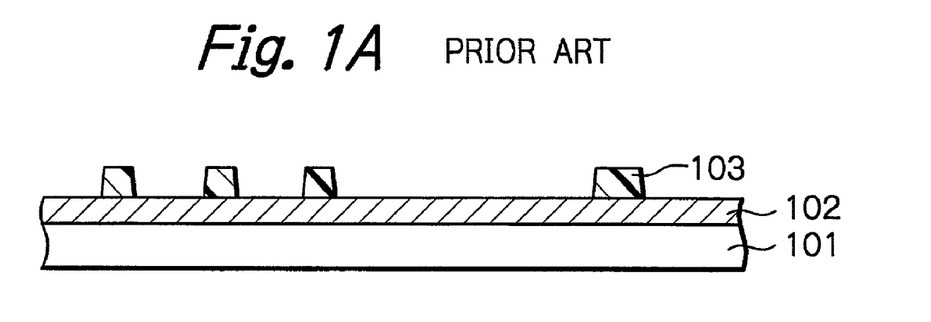
FIGS. 1A, 1B and 1C are cross-sectional views for explaining a first prior art method for manufacturing a semiconductor device.
Figure 1B:
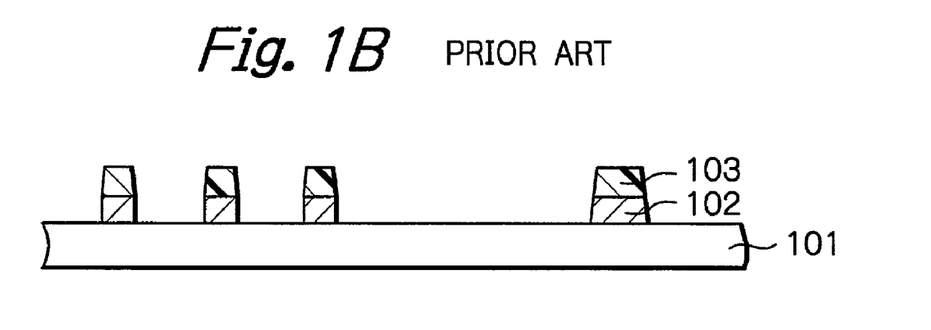
Figure 1C:
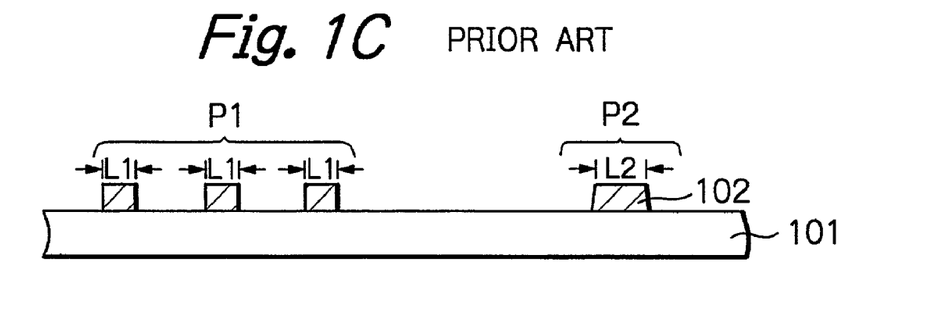
Figure 2:
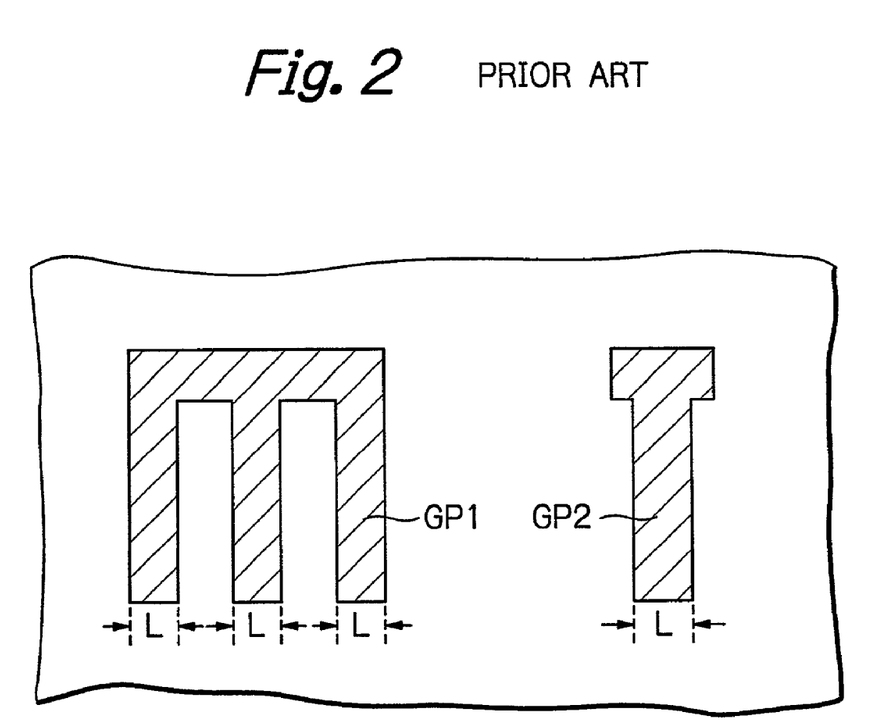
FIG. 2 is a plan view illustrating a photomask used in the manufacturing step as illustrated in FIG. 1A.

FIGS. 1A, 1B and 1C are cross-sectional views for explaining a first prior art method for manufacturing a semiconductor device using a photomask as illustrated in FIG. 2.

First, referring to FIG. 1A, a gate conductive layer 102 made of polycrystalline silicon or the like is deposited on a monocrystalline silicon substrate 101. Then, a photoresist layer 103 is coated on the gate conductive layer 102. Then, the photoresist layer 103 is exposed to ultraviolet light via the photomask of FIG. 2. Note that the photomask of FIG. 2 has a comb-shaped gate pattern GP1 and an isolated gate pattern GP2. Then, the photoresist layer 103 is developed, so that the photoresist layer 103 is patterned.

Next, referring to FIG. 1B, the gate conductive layer 102 is patterned by an etching process using the photoresist layer 103 as a mask, so that the gate conductive layer 102 is patterned.

Finally, referring to FIG. 1C, the photoresist layer 103 is removed. Thus, the gate conductive layer 102 has gate patterns P1 and P2 corresponding to the gate patterns GP1 and GP2, respectively.

In the semiconductor device of FIGS. 1A, 1B and 1C manufactured by the photomask of FIG. 2, even when the photomask of FIG. 2 has the same gate length L, the gate length L1 of the gate pattern P1 of the gate conductive layer 102 is smaller than the gate length L2 of the gate pattern P2 of the gate conductive layer 102. This is due to the following two reasons. One reason is that the proximity effect caused by light diffraction is larger in the gate pattern P1 than in the gate pattern P2, since the gate pattern GP1 has closely-arranged elements while the gate pattern GP2 has a single element. Another reason is that the amount of the gate conductive layer 102 redeposited on the sidewall thereof after the etching process of the gate conductive layer 102 is larger in the gate pattern P2 than in the gate pattern P1.

Figure 3A:
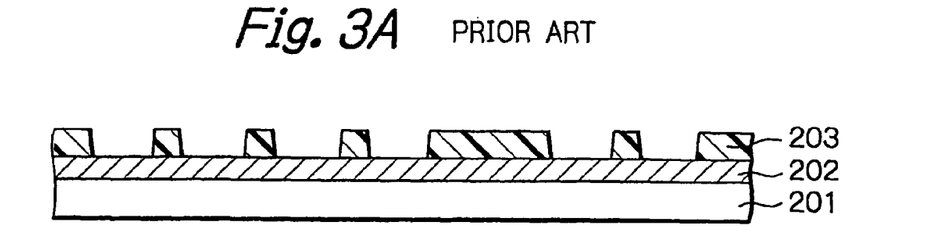
FIGS. 3A, 3B and 3C are cross-sectional views for explaining a second prior art method for manufacturing a semiconductor device.
Figure 3B:
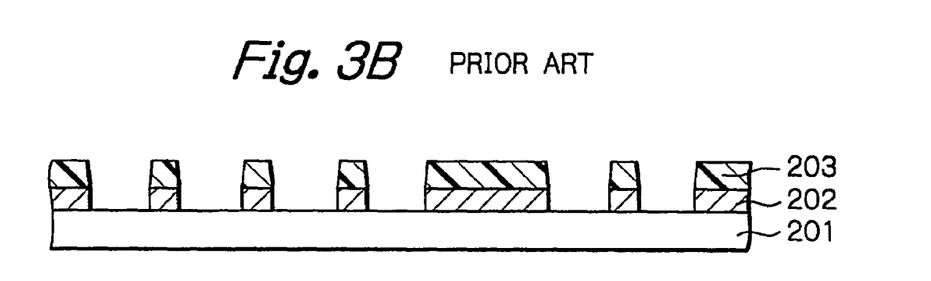
Figure 3C:
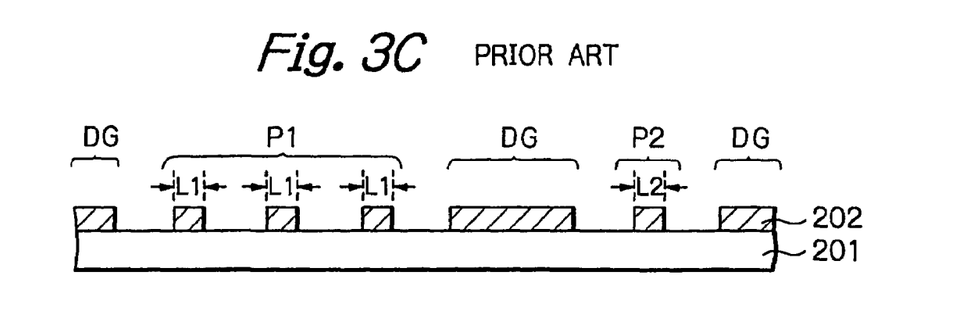
Figure 4:
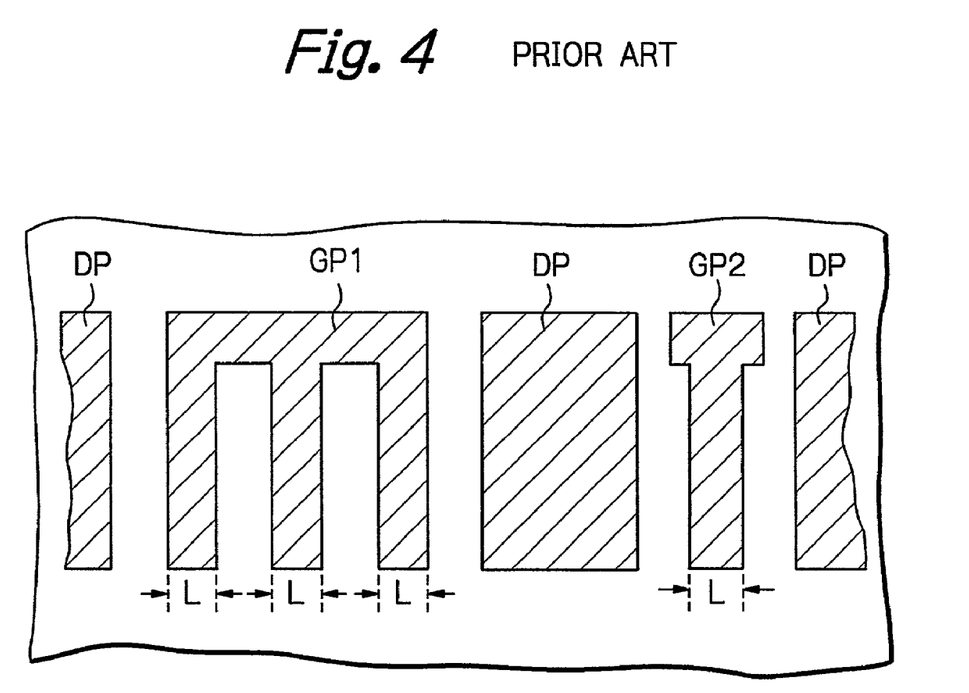
FIG. 4 is a plan view illustrating a photomask used in the manufacturing step as illustrated in FIG. 3A.

FIGS. 3A, 3B and 3C are cross-sectional views for explaining a second prior art method for manufacturing a semiconductor device using a photomask as illustrated in FIG. 4 (see JP-A-10-200109).

First, referring to FIG. 3A, a gate conductive layer 202 made of polycrystalline silicon or the like is deposited on a monocrystalline silicon substrate 201. Then, a photoresist layer 203 is coated on the gate conductive layer 202. Then, the photoresist layer 203 is exposed to ultraviolet light via the photomask of FIG. 4. Note that the photomask of FIG. 4 has dummy gate patterns DP in addition to the comb-shaped gate pattern GP1 and the isolated gate pattern GP2 of FIG. 2. Then, the photoresist layer 203 is developed, so that the photoresist layer 203 is patterned.

Next, referring to FIG. 3B, the gate conductive layer 202 is patterned by an etching process using the photoresist layer 203 as a mask, so that the gate conductive layer 202 is patterned.

Finally, referring to FIG. 3C, the photoresist layer 203 is removed. Thus, the gate conductive layer 202 has gate patterns P1 and P2 corresponding to the gate patterns GP1 and GP2, respectively, and also, has dummy gates DG corresponding to the dummy gate patterns DP.

In the semiconductor device of FIGS. 3A, 3B and 3C manufactured by the photomask of FIG. 4, since the photomask of FIG. 4 has the dummy patterns DP, the proximity effect caused by light diffraction is homogenized in the gate pattern P1 and in the gate pattern P2, and also, the amount of the gate conductive layer 202 redeposited on the sidewall thereof after the etching process of the gate conductive layer 202 is homogenized in the gate pattern P2 and in the gate pattern P1. As a result, the gate length L1 of the gate pattern P1 of the gate conductive layer 202 is substantially the same as the gate length L2 of the gate pattern 12 of the gate conductive layer 202.

In the semiconductor device of FIGS. 3A, 3B and 3C manufactured by the photomask of FIG. 4, however, when designing the photomask of FIG. 4, an additional design time for the dummy patterns DP is required. In particular, if a plurality of kinds of comb-shaped gate patterns are present, the additional designing time would be enormously large, which would A first embodiment of a method for manufacturing a semiconductor device consistent with the invention will be explained next with reference to FIGS. 5A, 5B, 5C, 6A, 6B, 6C and 7.

Figure 5A:
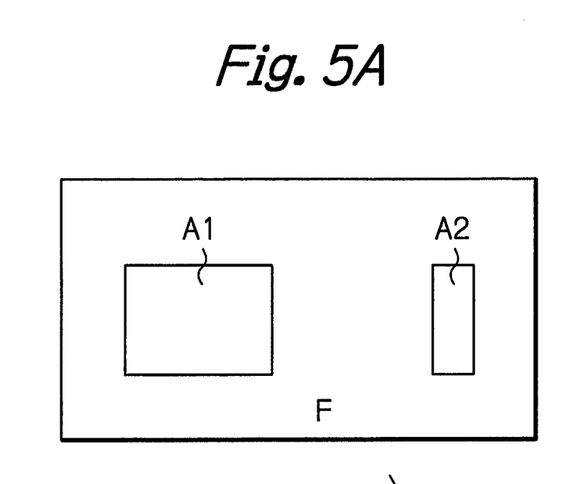
FIGS. 5A, 5B and 5C are diagrams for explaining a first step for designing a photomask used in a first embodiment of the method for manufacturing a semiconductor device according to the present invention.
Figure 5B:
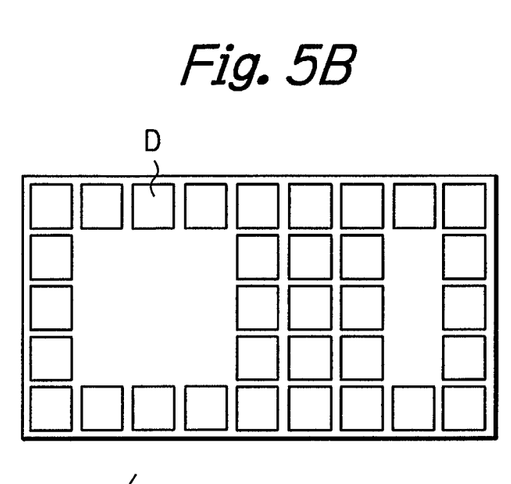
Figure 5C:
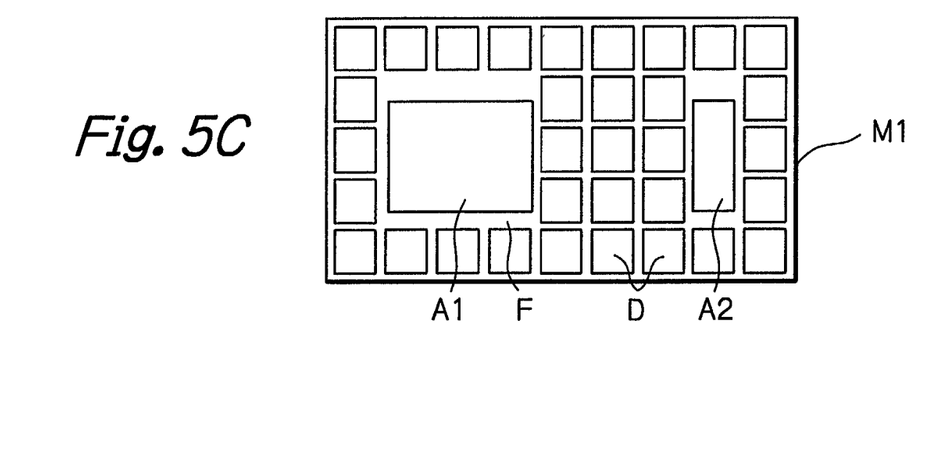

FIGS. 5A, 5B and 5C are diagrams for explaining a method for designing a first photomask M1 used in the first embodiment.

First, referring to FIG. 5A, active area patterns A1 and A2 for forming MOS transistors are set. Note that an area F other than the active area patterns A1 and A2 is defined as a field area pattern for isolating the MOS transistors from each other.

Next, referring to FIG. 5B, square dummy area patterns D arranged in rows and columns are set in the field area F.

Finally, referring to FIG. 5C, the active area patterns A1 and A2 and the dummy area patterns D are combined together to complete the first photomask M1.

Figure 6A:
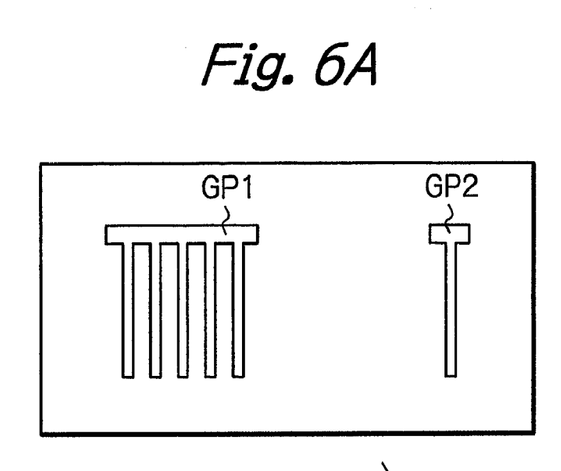
FIGS. 6A, 6B and 6C are diagrams for explaining a second step for designing a photomask used in the first embodiment of the method for manufacturing a semiconductor device according to the present invention.
Figure 6B:
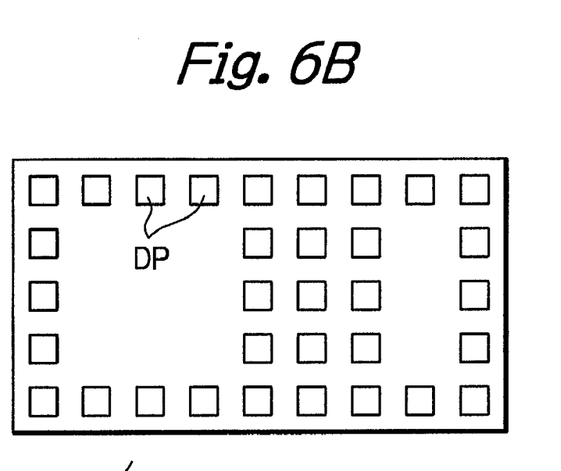
Figure 6C:
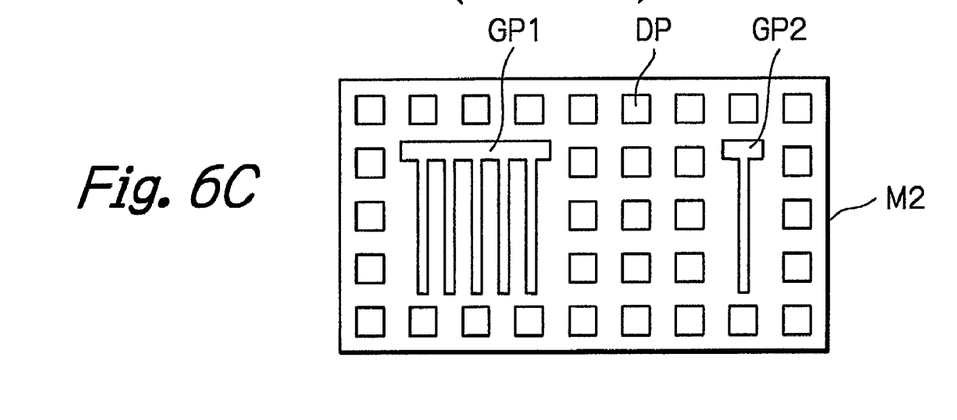

FIGS. 6A, 6B and 6C are diagrams for explaining a method for designing a second photomask M2 used in the first embodiment.

First, referring to FIG. 6A, a comb-shaped gate pattern GP1 and an isolated gate pattern GP2 are set in areas corresponding to the active area patterns A1 and AZ, respectively, of FIG. 5A.

Next, referring to FIG. 6B, dummy gate patterns DP are set in areas corresponding to the square dummy patterns D of FIG. 5B. In this case, each of the dummy gate patterns DP is a reduction or the corresponding square dummy gate area D.

Finally, referring to FIG. 6C, the gate patterns GP1 and GP2 and the dummy gate patterns DP are combined together to complete the second photomask M2.

Figure 7:
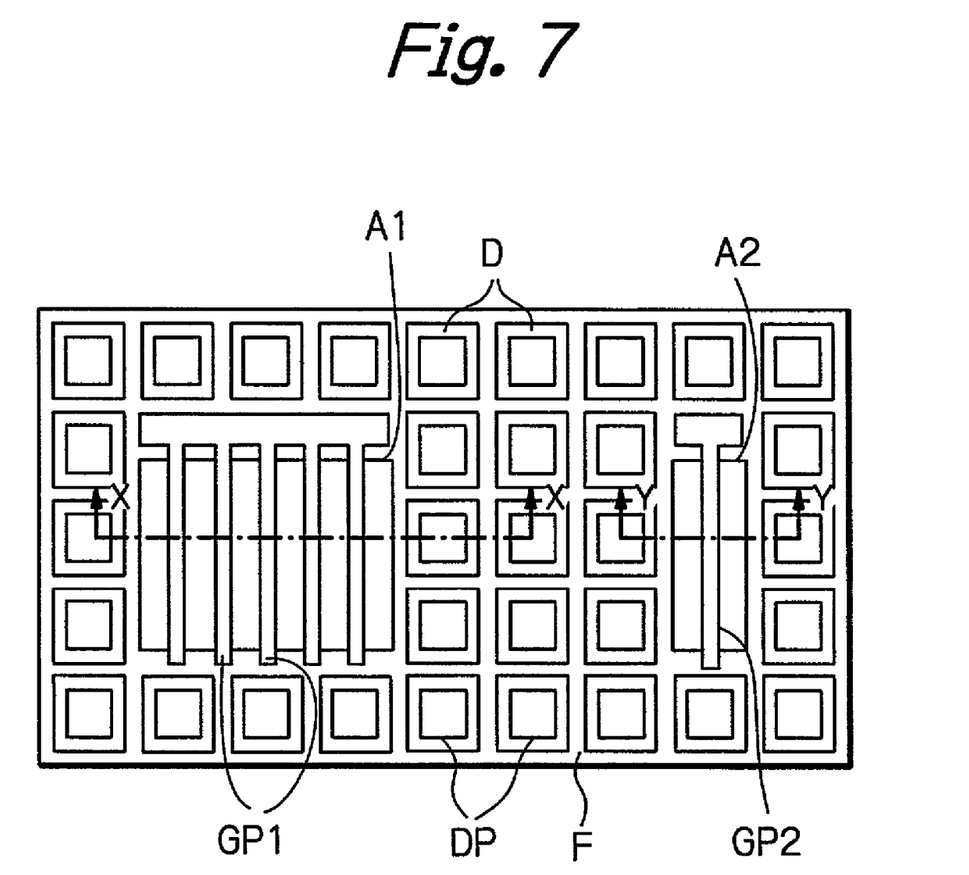
FIG. 7 is a plan view illustrating the semiconductor device obtained by the photomask as illustrated in FIGS. 5A, 5B, 5C and FIGS. 6A, 6B and 6C.

FIG. 7 is a plan view illustrating the semiconductor device obtained by using the photomask M1 of FIG. 5C and the photomask M2 of FIG. 6C.

Note that the dummy gate patterns DP of FIG. 6C are similar to the dummy patterns D of FIG. 5C for forming a shallow trench isolation (STI) layer using a chemical mechanical polishing (CMP) process, which will be explained later. Therefore, if the semiconductor device of FIG. 7 is manufactured by such an STI layer using a CMP process, an additional design for the dummy gate patterns DP requires only a little work, which would not increase the turnaround time.

The method for manufacturing the semiconductor device of FIG. 7 is explained next with reference to FIGS. 8A through 8K, which are cross-sectional views taken along the lines X—X and Y—Y in FIG. 7.

Figure 8A:
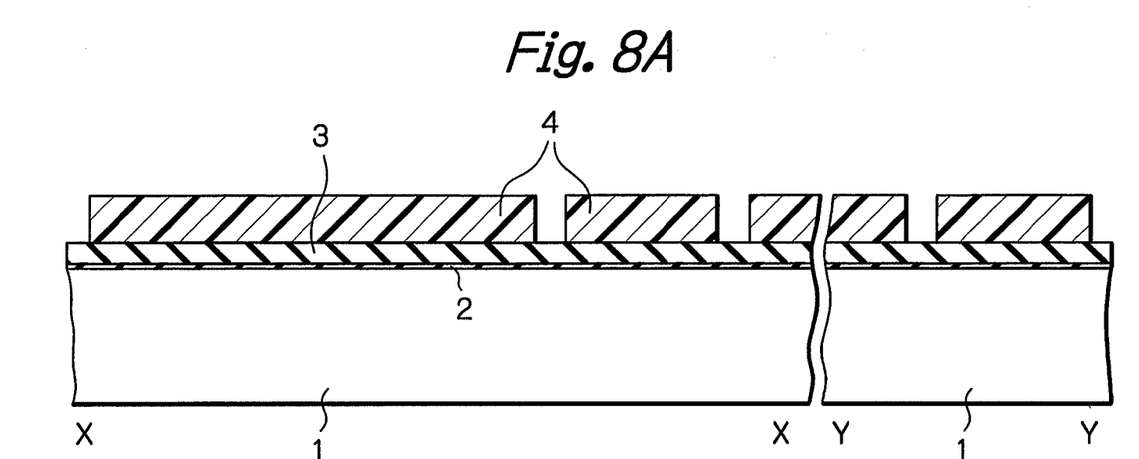
FIGS. 8A through 8K are cross-sectional views for explaining a method for manufacturing the semiconductor device of FIG. 7.

First, referring to FIG. 8A, a monocrystalline silicon substrate 1 is thermally oxidized to form a silicon oxide layer 2 thereon. Then, a silicon nitride layer 3 is deposited on the silicon oxide layer 2. Then, a photoresist layer 4 is coated on the silicon nitride layer 3. Then, the photoresist layer 4 is irradiated with ultraviolet light via the photomask M1 of FIG. 5C. Then, the photoresist layer 4 is developed, so that the photoresist layer 4 is patterned.

Figure 8B:
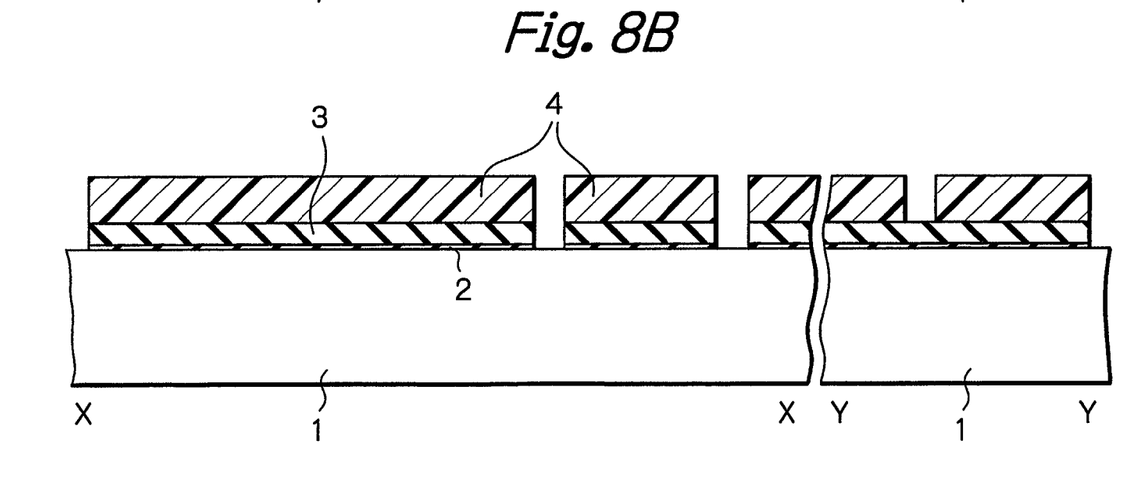

Next, referring to FIG. 8B, the silicon nitride layer 3 is etched by using the photoresist layer 4 as a mask and the silicon oxide layer 2 as an etching stop. Then the silicon oxide layer 2 is etched by using the silicon nitride layer 3 as a mask. Then, the photoresist layer 4 is removed.

Figure 8C:
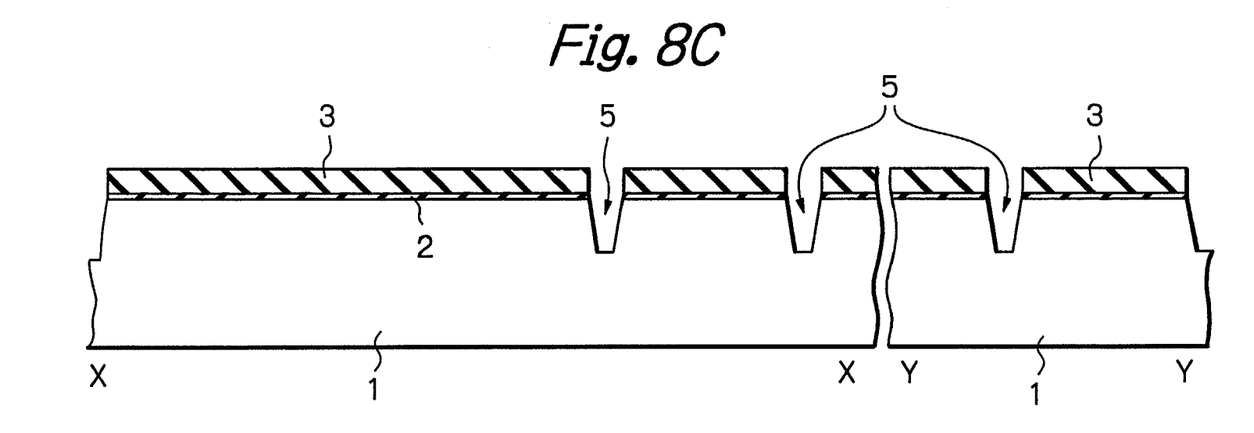

Next, referring to FIG. 8C, trenches 5 are perforated in the silicon substrate 1 by etching the silicon substrate 1 using the silicon nitride layer 3 and the silicon oxide layer 2 as a mask. This results grid shaped trenches being formed in the element isolation region.

Figure 8D:
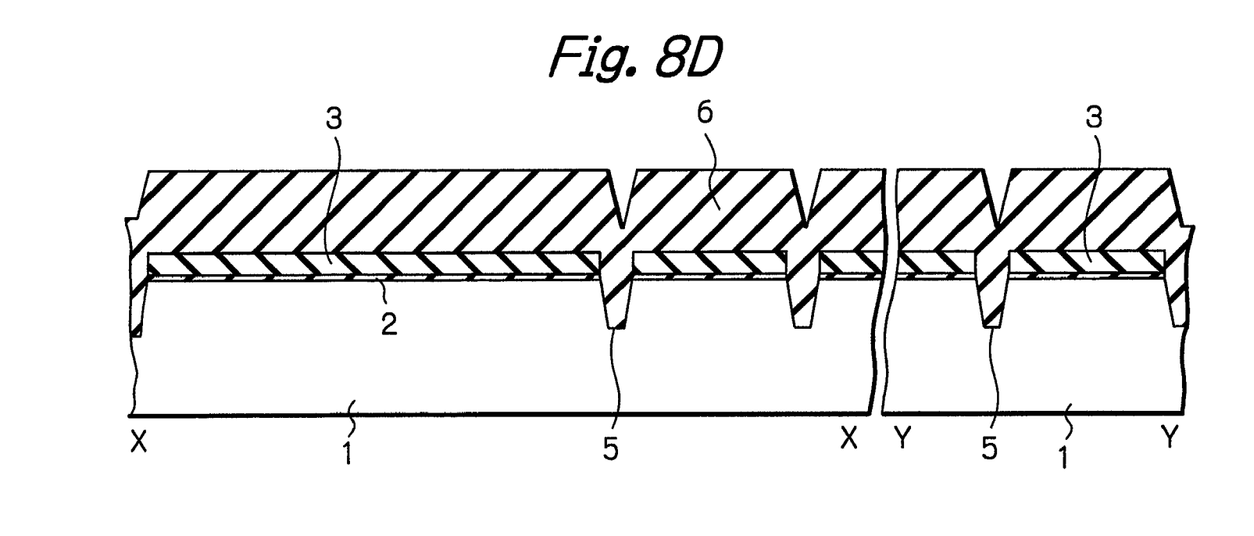

Next, referring to FIG. 8D, a silicon oxide layer 6 is formed on the entire surface by a thermal oxidation process and a chemical vapor deposition (CVD) process, so that the silicon oxide layer 6 is completely buried in the trenches 5.

Figure 8E:
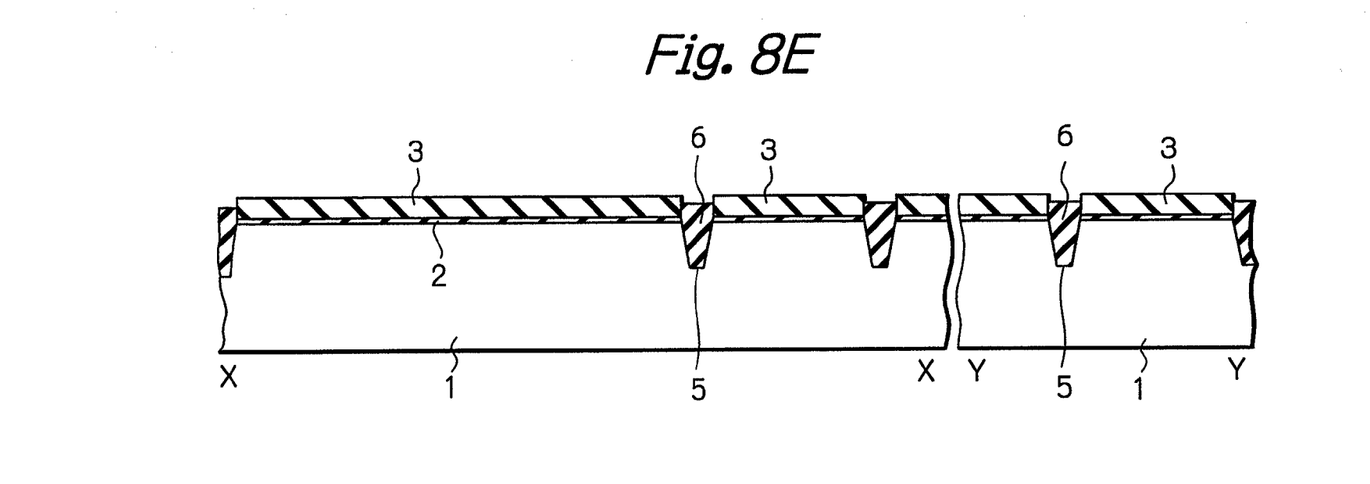

Next, referring to FIG. 8E, a CMP process is carried out to flatten the silicon oxide layer 6 using the silicon nitride layer 3 as a stop.

Figure 8F:
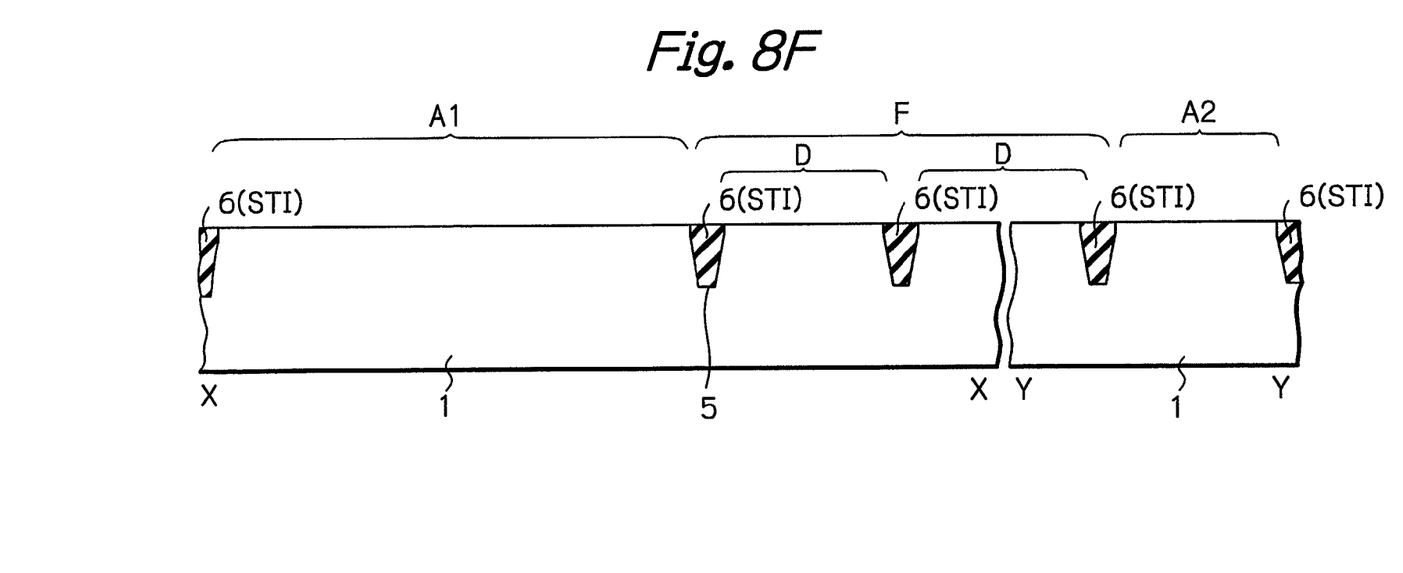

Next, referring to FIG. 8F, the silicon nitride layer 3 is removed. Then, a CMP process is again carried out to flatten the silicon oxide layer 6, so that the top surface of the silicon oxide layer 6 substantially coincides with the surface of the silicon substrate 1, thus forming STI layers. As a result, areas corresponding to the active area patterns A1 and A2, the field area pattern F and the dummy area patterns D of FIG. 5C are partitioned.

Figure 8G:
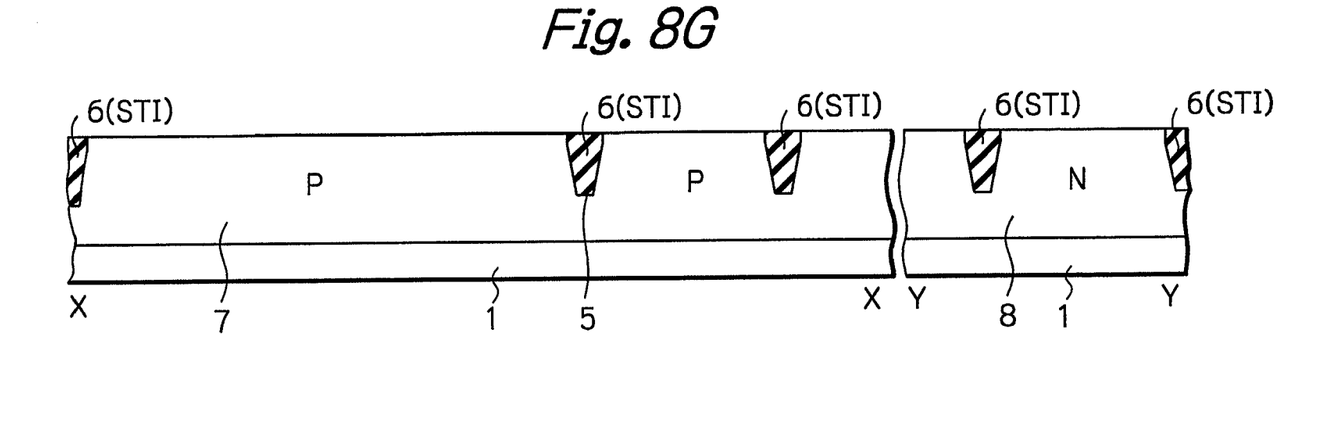

Next, referring to FIG. 8G, after a photoresist pattern layer (not shown) is formed to cover the area A2 and its adjacent area, P-type impurities are implanted into the silicon substrate 1 to form a P-type impurity diffusion region (well) 7 within the silicon substrate 1. Similarly, after a photoresist pattern layer (not shown) is formed to cover the area A1 and its adjacent area, N-type impurities are implanted into the silicon substrate 1 to form an N-type impurity diffusion region (well) 8 within the silicon substrate 1. In this case, note that the impurity type of the dummy areas D can be of a P-type or an N-type.

Figure 8H:
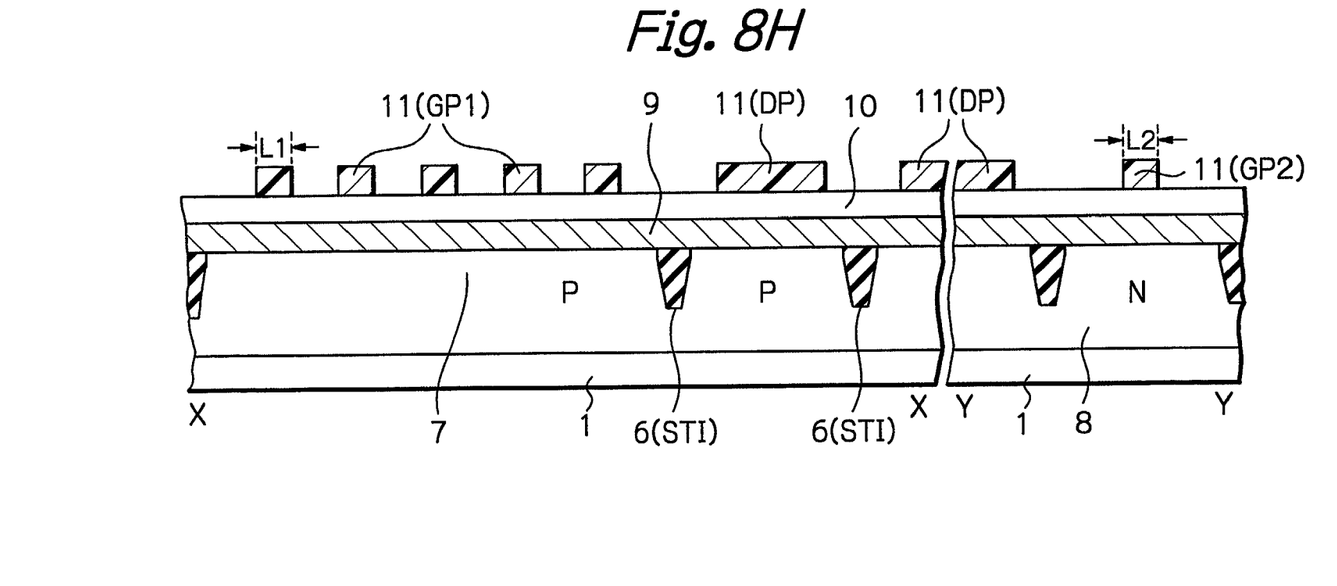

Next, referring to FIG. 8H, a gate conductive layer 9 made of polycrystalline silicon or the like is deposited by a CVD process or a sputtering process. Then, an anti-reflection coating (ARC) layer 10 made of organic material is coated on the gate conductive layer 9. Then, a photoresist pattern layer 11 is coated on the ARC layer 10, and is irradiated with ultraviolet light via the photomask M2 of FIG. 6C. Then, the photoresist layer 11 is developed and patterned as illustrated in FIG. 8H. In this case, due to the dummy patterns DP, the length L1 of the photoresist layer 11(GP1) of the active area A1 and the length L2 of the photoresist layer 11(GP2) of the active area A2 are homogenized regardless of the proximity effect.

Figure 8I:
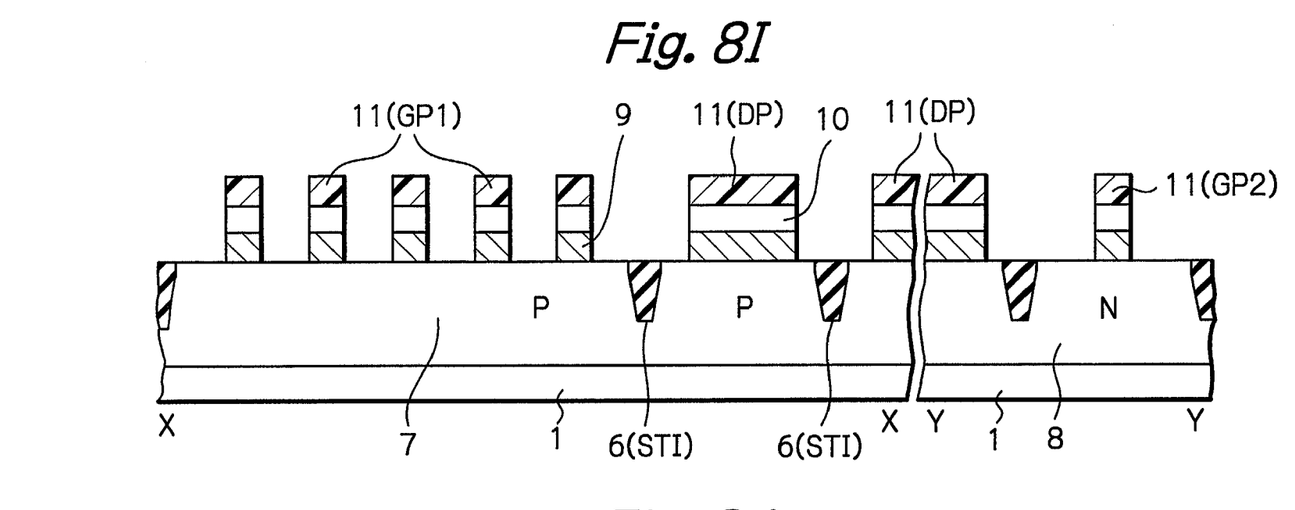

Next, referring to FIG. 8I, the ARC layer 10 and the gate conductive layer 9 are sequentially etched by using the photoresist layer 11 as a mask.

Figure 8J:
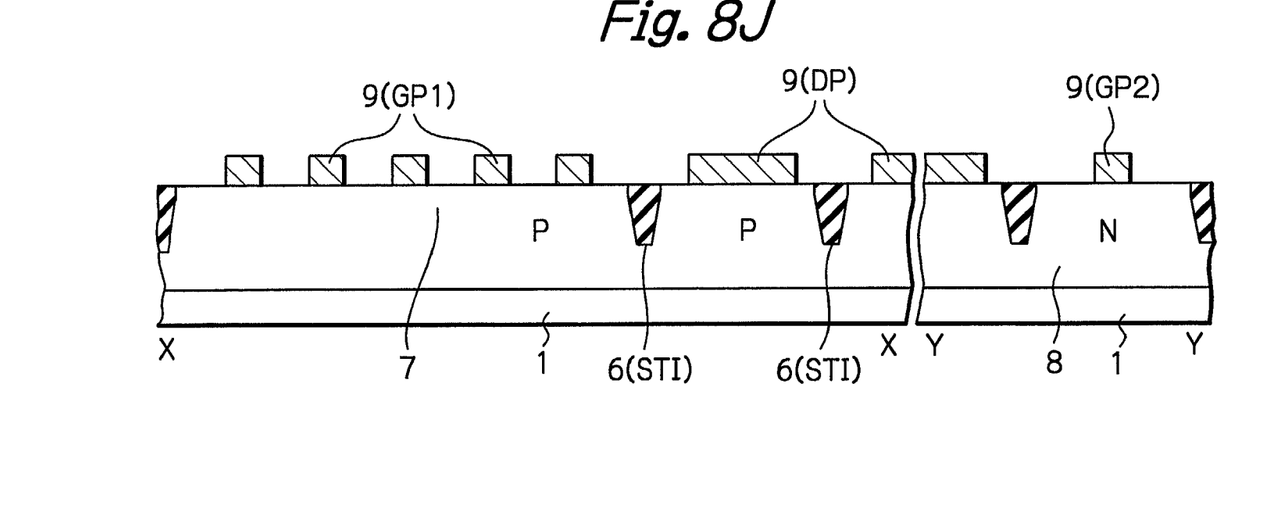

Next, referring to FIG. 8J, the photoresist layer 11 and the ARC layer 10 are sequentially removed.

Figure 8K:
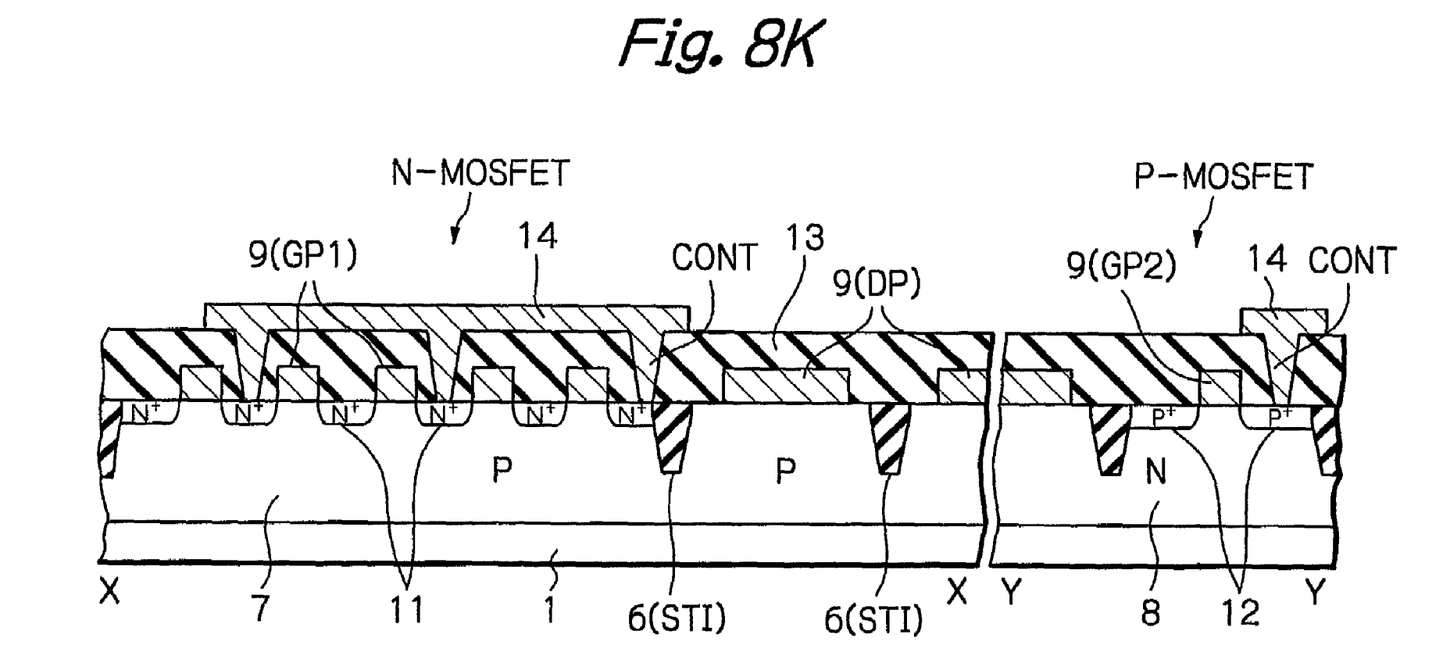

Finally, referring to FIG. 8K, after a photoresist pattern layer (not shown) is formed to cover the N-type diffusion region 8, N-type impurities are implanted into the silicon substrate 1 in self-alignment with the gate conductive layer 9(GP1), to form $N^+$-type regions 11 within the P-type impurity region 7. Similarly, after a photoresist pattern layer (not shown) is formed to cover the P-type diffusion region 7, P-type impurities are implanted into the silicon substrate 1 in self-alignment with the gate conductive layer 9(GP2), to form $P^+$-type regions 12 within the N-type impurity region 7. Then, a boron-included phosphor-silicate glass (BPSG) layer 13 is deposited on the entire surface by a CVD process, and contact holes CONT are perforated in the BPSG layer 13. Then, connection layers 14 are formed and connected via the contact holes CONT to the corresponding impurity diffusion regions.

The necessity of the dummy area patterns D of the photomask M1 of FIG. 5C is explained with reference to FIGS. 9A and 9B.

Figure 9A:
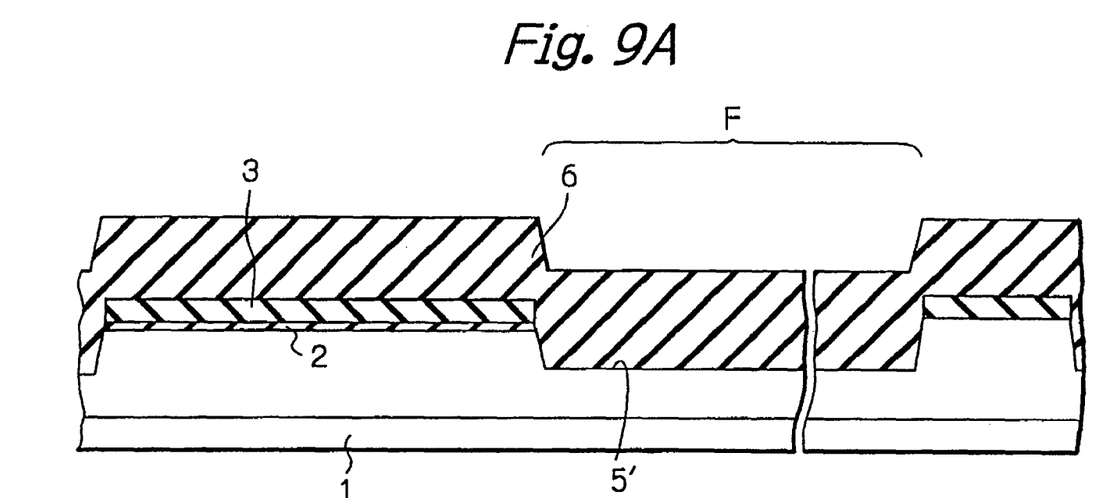
FIGS. 9A and 9B are cross-sectional views for explaining the necessity of the dummy gate patterns of FIG. 5C.
Figure 9B:
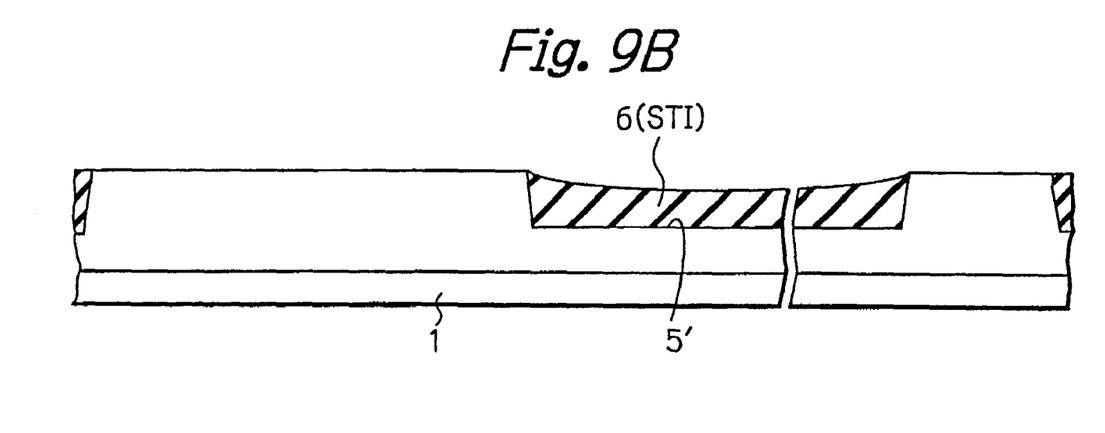

If the dummy area patterns D are absent in the photomask M1 of FIG. 5C, as illustrated in FIG. 9A, which corresponds to FIG. 8D, a trench 5' is formed in the entire field area F. Therefore, after the silicon oxide layer 2, the silicon nitride layer 3 and the silicon oxide layer 6 are formed, a CMP process is carried out so that an STI layer 6 (STI) is buried in the trench 5' as illustrated in FIG. 9B. However, in this case, the STI layer 6 (STI) becomes indented. This deteriorates the reliability of wiring (connection) layers formed on the STI layer 6 (STI). Thus, the dummy area patterns D are indispensable for manufacturing an STI-structured semiconductor device using a CMP process.

Figure 10:
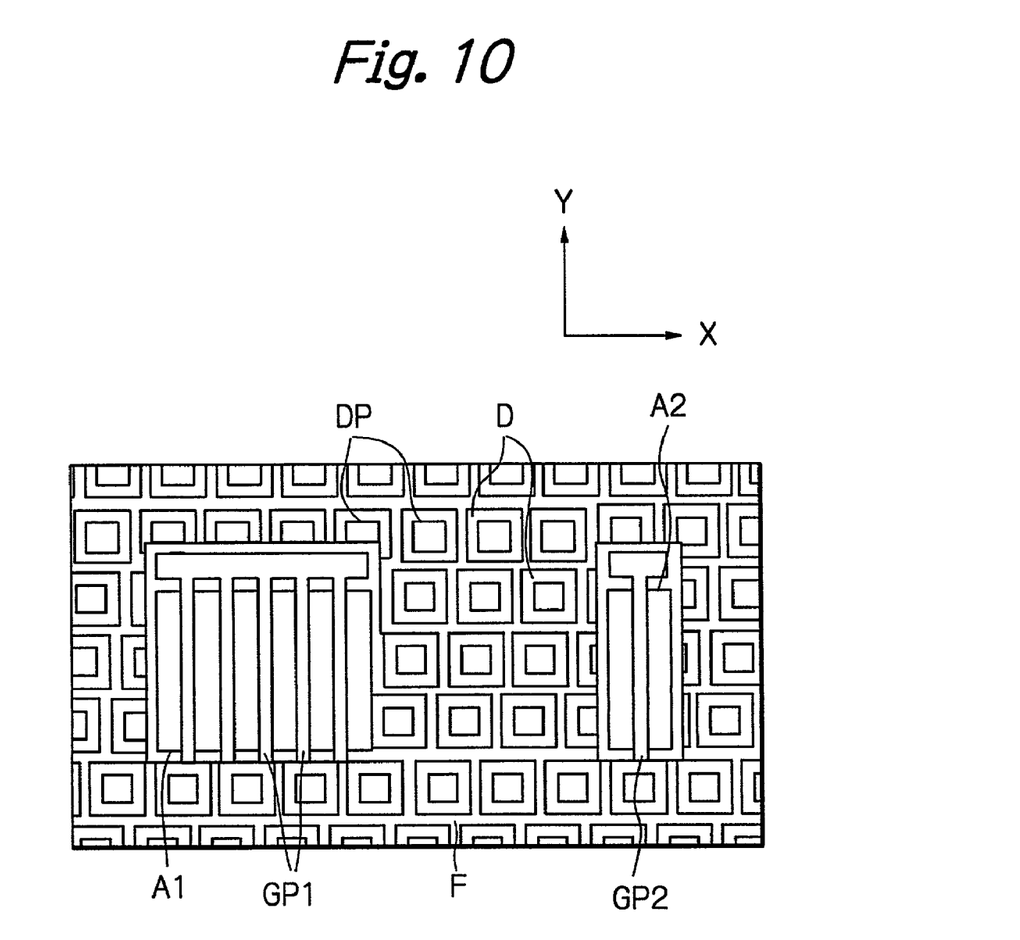
FIG. 10 is a plan view illustrating a second embodiment of the semiconductor device according to the present invention.
Figure 11A:
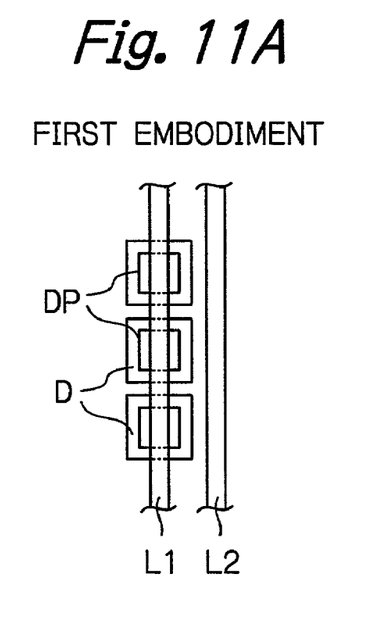
FIGS. 11A and 11B are plan views for explaining the effect of the semiconductor device of FIG. 10.
Figure 11B:
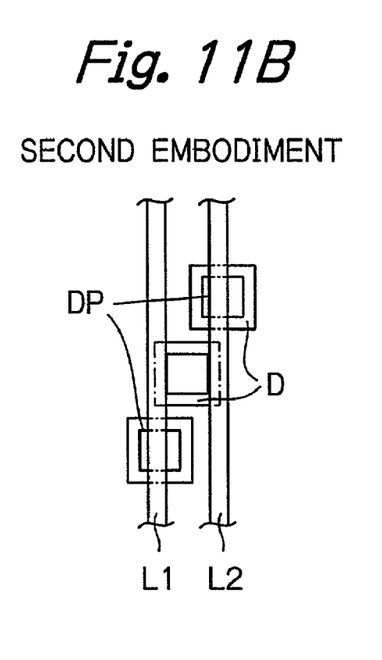

In FIG. 10, which illustrates a second embodiment of the present invention, the rows of the dummy area patterns D and the dummy gate patterns DP along the X-direction are shifted from each other. As a result, the parasitic capacitance of wiring (connection) layers L1 and L2 formed over the dummy gate patterns DP is homogenized, which would improve the characteristics. That is, as illustrated in FIG. 11A which schematically shows the wiring layers L1 and L2 in a case of the first embodiment, the parasitic capacitance of the wiring layer L1 is larger than the parasitic capacitance of the wiring layer L2. On the other hand, as illustrated in FIG. 11B which schematically shows the wiring layers L1 and L2 in a case of the second embodiment, the parasitic capacitance of the wiring layer L1 is substantially the same as that of the wiring layer L2.

In the above-described second embodiment, the columns of the dummy area patterns D and the dummy gate patterns DP along the Y-direction can be shifted from each other. Also, the rows and columns of the dummy area patterns D and the dummy gate patterns DP along the X-direction and the Y-direction can be both shifted from each other. Further, the dummy area patterns D and the dummy gate patterns DP can be sloped.

Additionally, the dummy area patterns D and the dummy gate patterns DP can be rectangular, polygonal or circular.

As explained hereinabove, according to the present invention, since dummy gate patterns are derived from dummy area patterns so that an additional design time for the dummy gate patterns is reduced, the turnaround time can be decreased, thus decreasing the manufacturing cost.

The invention claimed is:

1. A method of manufacturing a semiconductor device, comprising:
    performing a selective etching on a semiconductor substrate having first and second active areas and an isolation area intervening between said first and second active areas, thereby forming a grid-shaped trench in said isolation area of said semiconductor substrate to define a plurality of dummy regions each surrounded by said grid-shaped trench;
    forming an insulating layer in said grid-shaped trench;
    forming a conductive layer on said semiconductor substrate; and
    selectively removing said conductive layer to form a transistor gate over each of said first and second active areas and a dummy gate over each of said dummy regions, said dummy gate having a reduced shape area as compared to a shape area of a corresponding one of said dummy regions.

2. The method as set forth in claim 1, wherein said insulating layer is formed by chemical mechanical polishing process.

3. The method as set forth in claim 1, wherein said transistor gate and said dummy gate are formed by use of such a mask pattern that is derived by combining a transistor gate pattern and a dummy gate pattern which is obtained by reducing a mask pattern for forming said grid-shaped trench.

* * * * *